(12) United States Patent
Cushman et al.

(10) Patent No.: US 7,167,363 B1
(45) Date of Patent: Jan. 23, 2007

(54) METHODS AND APPARATUS FOR DIRECTING AN AIR STREAM THROUGH A CIRCUIT BOARD ASSEMBLY

(75) Inventors: James Cushman, San Jose, CA (US); Sridevi Iyengar, San Jose, CA (US); Hsing-Sheng Liang, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 242 days.

(21) Appl. No.: 10/657,444

(22) Filed: Sep. 8, 2003

(51) Int. Cl.
*H05K 7/20* (2006.01)

(52) U.S. Cl. .................. 361/694; 361/690; 361/692

(58) Field of Classification Search ............. 361/801, 361/687, 688, 702, 711; 439/485
See application file for complete search history.

(56) References Cited

U.S. PATENT DOCUMENTS

| | | | | |
|---|---|---|---|---|
| 5,343,362 A | * | 8/1994 | Solberg ............... | 361/710 |
| 5,563,768 A | * | 10/1996 | Perdue ............... | 361/695 |
| 6,430,052 B1 | | 8/2002 | Kordes et al. ......... | 361/719 |
| 6,480,380 B1 | | 11/2002 | French et al. ......... | 361/690 |
| 6,481,527 B1 | | 11/2002 | French et al. ......... | 181/201 |
| 6,529,374 B1 | * | 3/2003 | Yamashita et al. ..... | 361/687 |
| 6,711,019 B1 | * | 3/2004 | Manabe et al. ........ | 361/704 |
| 6,714,416 B1 | | 3/2004 | McLeod et al. ........ | 361/719 |
| 6,728,104 B1 | | 4/2004 | Ahmad et al. ......... | 361/704 |

* cited by examiner

*Primary Examiner*—Kamand Cuneo
*Assistant Examiner*—Ivan Carpio
(74) *Attorney, Agent, or Firm*—BainwoodHuang

(57) ABSTRACT

An air stream distribution apparatus directs portions of an air stream, at substantially ambient temperatures, to serially arranged circuit board components of a circuit board assembly. The air stream distribution apparatus splits an incoming air stream into air stream portions and directs each air stream portion toward each serially arranged circuit board component. Such direction of the portion of the air stream, by the air stream distribution apparatus, minimizes overheating and failure of the circuit board components. Furthermore, the air stream distribution apparatus minimizes a decrease in the pressure of the air stream as the air stream travels from the air stream source. The air stream distribution apparatus, therefore, ensures that circuit board components located at relatively large distances from the air stream source receive air from the air stream to minimize overheating and potential failure.

26 Claims, 7 Drawing Sheets

METHODS AND APPARATUS FOR DIRECTING AN AIR STREAM THROUGH A CIRCUIT BOARD ASSEMBLY

BACKGROUND

A typical circuit board assembly includes a circuit board formed of circuit board materials (e.g., fiberglass, copper, etc.) and circuit board components mounted to the circuit board. Examples of circuit board components include integrated circuits (ICs), resistors, inductors, and transceivers. Conventionally, circuit board components generate heat during operation. Various heat removal mechanisms draw heat away from the respective circuit board components to maintain the temperature of the circuit board components within a certain, safe temperature range (e.g., a temperature that allows proper operation of the circuit board component).

Transceivers, such as XENPAK optical transceivers, generate heat during operation. Manufacturers of such transceivers, specify that these transceivers operate at a temperature below a maximum allowable temperature of 70° C. in order to function properly. In the case where the transceivers operate at a temperature greater than 70° C., the transceivers run the risk of operating at improperly (e.g., corrupting data) or, perhaps in extreme case, sustaining permanent damage (e.g., overheat, burnout, etc.). Transceivers, therefore, typically orient within an air stream (e.g. such as provided by a fan assembly) that removes heat, via convection cooling, generated by the transceivers during operation.

Other conventional circuit board components, such as IC's, also utilize convection cooling to remove heat generated during operation. Typically, such IC's utilize an airflow-directing device, such as a baffle, to receive an air stream. During operation, the baffle captures and directs a portion of the air stream toward the IC's during operation. The redirected air stream passes over, and carries heat away from, the IC's.

SUMMARY

Conventional techniques for cooling circuit board components suffer from a variety of deficiencies.

Certain conventional transceivers, such as XENPAK transceivers, are configured to removably connect (e.g., "plug into") an associated circuit board. Such a configuration limits the ability for the transceiver modules to use conventional heat sinks (e.g., flanged thermally conductive device, such as a metallic device, that contacts a package of the IC) to facilitate cooling. As described above, transceivers typically utilize convection cooling (e.g., an air stream that passes over the transceiver) to remove the heat generated during operation and maintain the temperature of the transceivers below a maximum allowable temperature.

Conventional circuit board assemblies, however, have multiple transceivers mounted to the circuit board in a serial configuration (e.g., in a one-after-another or side-by-side configuration) along a path of the air stream. For example, assume a circuit board having three transceivers arranged in a serial or side-by-side configuration. In such a configuration, a first transceiver orients in a first position proximal (e.g., nearest) to an air stream source, a second transceiver orients behind the first transceiver, distal to the air stream source, and the third transceiver orients behind the second transceiver further distal to the air stream source. As indicated below, such a configuration minimizes the ability for the air stream to effectively remove heat from the all of transceivers in the serial configuration, thereby resulting in the improper operation (e.g., incorrect signal generation) or damage (e.g., overheating, burnout, etc.) of the transceivers located at a relatively large distance from an air stream source.

For example, assume a circuit board assembly has multiple transceiver modules mounted in the side-by-side configuration along an air stream path. During operation, as an air stream, generated by the air stream source, travels from a first transceiver to the secondary transceivers (e.g., second and third transceivers) in the air stream path, the secondary receivers create drag (i.e., hydraulic resistance) on the air stream. Such drag decreases the velocity of the air stream, resulting in a loss in momentum of the air stream. The loss in momentum minimizes the amount of heat removed from the secondary transceivers located further along the air stream path relative to both the first transceiver and the air stream source. In such an arrangement, the secondary transceivers can operate improperly or malfunction due to overheating.

In another example, in a phenomenon known as "bypass", assume a circuit board assembly has multiple transceiver modules mounted in the side-by-side configuration along an air stream path. The transceiver closest in proximity to the air stream source (e.g., the first transceiver) can deflect the air stream away from the other transceivers (e.g. secondary transceivers) located distal to (e.g., behind) the first transceiver relative to the air stream source. Such deflection reduces the amount of the air stream received by the secondary transceivers, thereby leading to overheating and potential malfunction of the secondary transceivers.

In another example, again assume a circuit board assembly has multiple transceiver modules mounted in the side-by-side configuration along an air stream path. As the air stream contacts the first transceiver, heat from the first transceiver increases the temperature of (e.g., heats) the air stream. The heated air stream then travels to the secondary transceivers located along the air stream path. By heating the air stream, the first transceiver reduces the temperature difference between the air stream and the secondary transceivers. Such reduction in temperature difference reducing the ability for the air stream to effectively cool the secondary transceivers located further along the air stream path relative to the first transceiver and to the air stream source.

Also as described above, conventional circuit board components utilize an airflow-directing device to direct an air stream toward a circuit board component mounted to a circuit board. However, in the case where the circuit board has multiple circuit board components arranged in a side-by-side (e.g., serial) manner relative to the air stream path, the conventional airflow-directing device directs an air stream to a single circuit board component (e.g., the first circuit board component located in relatively close proximity to a source of the air stream). Secondary circuit board components (e.g., circuit board components located, relative to the air stream, behind the first circuit board component), receive minimal air from the airflow-directing device and therefore, can overheat and potentially malfunction.

By contrast, embodiments of the present invention significantly overcome such deficiencies and provide mechanisms for directing an air stream to circuit board components of a circuit board. An air stream distribution apparatus directs portions of an air stream, at substantially ambient temperatures, to serially arranged circuit board components of a circuit board assembly. The air stream distribution apparatus splits an incoming air stream into air stream portions and directs each air stream portion toward each serially arranged circuit board component. Such direction of the portion of the air stream, by the air stream distribution apparatus, minimizes overheating and failure of the circuit board components. Furthermore, the air stream distribution apparatus minimizes a decrease in the pressure of the air stream as the air stream travels from the air stream source. The air stream distribution apparatus, therefore, ensures that circuit board components located at relatively large distances from the air stream source receive air from the air stream to minimize overheating and potential failure.

In one arrangement, an air stream distribution apparatus has a base configured to couple with a circuit board, the base defining a first end and a second end. The air stream distribution apparatus also has deflectors in communication with the base, the deflectors arranged in series between the first end and the second end defined by the base. Each of the deflectors defines a leading edge, the leading edge of each of the deflectors defining a height relative to a plane defined by the base. The height defined by the leading edge of each deflector increases along an air stream direction between the first end and the second end defined by the base. Each of the deflectors is configured to direct a corresponding portion of an air stream toward a respective area of the circuit board (e.g., circuit board components of the circuit board). The different height of each deflector allows the air stream distribution apparatus to direct the air stream to multiple circuit board components and, therefore, maximize contact between the air stream and the circuit board components. By maximizing contact between the air stream and the circuit board components, the airflow distribution apparatus minimizes overheating of all of the circuit board components of a circuit board assembly and maintains the temperature of the circuit board components within a particular operational range.

In one arrangement, each deflector defines an angle relative to the plane defined by the base. The angle of each deflector increases, relative to the plane defined by the base, along the air stream direction between the first end and the second end defined by the base. Such an arrangement of the deflectors allows deflectors located at a relatively large distance from an air stream source (e.g., a fan assembly) to capture a volume of air sufficient to contact and cool the surface of an associated circuit board component.

In one arrangement, each deflector defines a trailing edge where a distance between the leading edge and the trailing edge of each deflector defines a deflector length. The deflector length of each deflector increases along the air stream direction between the first end and the second end defined by the base. An increase in the length creates an increase in the velocity of the air stream (e.g., portion of the air stream) captured by the deflector. Such an increase in velocity of the air stream portion counters a loss of momentum of the air stream as the air stream travels away from the air stream source. By countering the loss in momentum of the air stream, the increasing length of the deflectors allows the airflow distribution apparatus to provide convection cooling to circuit board components located at a relatively large distance from the air stream source.

In one arrangement, the leading edge, defined by a deflector, further defines a first thickness. The trailing edge, defined by a deflector, further defines a second thickness where the second thickness of the trailing edge is less than the first thickness of the leading edge. In such an arrangement, for example, the leading edge defined by the deflector further defines a rounded edge and the trailing edge defined by the deflector further defines a tapered edge such that the deflector defines an airfoil shape. The airfoil shape minimizes a loss in pressure and velocity of an air stream as the air stream travels from a fan assembly and across circuit board components of a circuit board.

The features of the invention, as described above, may be employed in systems, devices and methods for distributing an air stream to a circuit board as well as other computer-related components such as those of Cisco Systems of San Jose, Calif.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide mechanisms for directing an air stream to circuit board components of a circuit board. An air stream distribution apparatus directs portions of an air stream, at substantially ambient temperatures, to serially arranged circuit board components of a circuit board assembly. The air stream distribution apparatus splits an incoming air stream into air stream portions and directs each air stream portion toward each serially arranged circuit board component. Such direction of the portion of the air stream, by the air stream distribution apparatus, minimizes overheating and failure of the circuit board components. Furthermore, the air stream distribution apparatus minimizes a decrease in the pressure of the air stream as the air stream travels from the air stream source. The air stream distribution apparatus, therefore, ensures that circuit board components located at relatively large distances from the air stream source receive air from the air stream to minimize overheating and potential failure.

Figure 1:
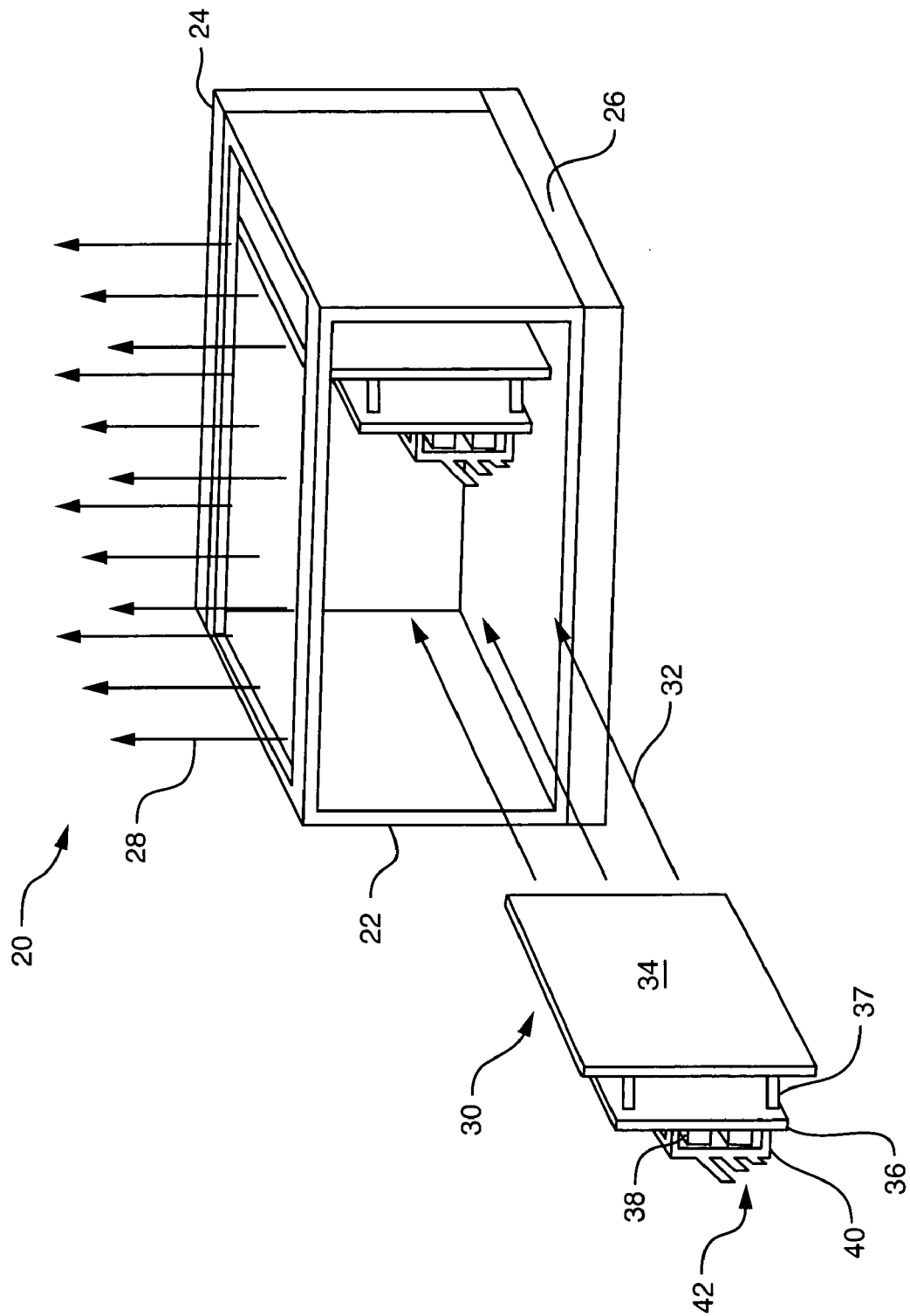
FIG. 1 illustrates a block diagram of a computer system using an air stream distribution apparatus, according to one embodiment of the invention.

FIG. 1 shows a computer system 20, suitable for use by embodiments of the invention. The computer system 20 includes a card cage 22, a back plane 24, and an air stream source or fan assembly 26 that provides an air stream 28 that flows through the card cage 22 at an ambient or approximately ambient temperature. The system 20 further includes multiple circuit board assemblies 30 which connect with the back plane 24 when installed in the card cage 22 in the direction 32.

Each circuit board assembly 30 includes, for example, a support member 34, a circuit board 36, circuit board components 38 mounted to the circuit board 36, and an air stream distribution apparatus 40.

The support member or carrier tray 34 couples to the circuit board 36 via side portions or stand-offs 37 attached to the support member 34 and operates as a carrier for holding the circuit board 36 for proper alignment and connection with the back plane 24. In one arrangement, the support member 34 aligns the air stream distribution apparatus 40 within the air stream 28 to allow the air stream distribution apparatus 40 to receive and direct portions of the air stream 28 to the circuit board 36 and circuit board components 38, thereby allowing cooling of the circuit board 36 and the circuit board components 38.

The circuit board components 38 electrically couple to the circuit board 36. In one arrangement, the circuit board components 38 are configured as transceiver modules, such as optical transceiver modules, that removably couple with (e.g., plug into) the circuit board 36.

The air stream distribution apparatus 40 facilitates cooling of the circuit board 26 and is configured to direct portions of the air stream 28, as provided by the fan assembly 26, toward respective areas of the circuit board 36 (e.g., the areas having circuit board components 38). As the air stream distribution apparatus 40 causes the air stream 28 (e.g., portions of the air stream 28) to travel past the circuit board components 38, the air stream 28 carries heat away from the circuit board components 38, thereby cooling (e.g., providing convective cooling to) the circuit board components 38. In one arrangement, the air stream distribution apparatus 40 is formed of a zinc-plated, cold-rolled steel that aids in shielding the circuit board 36 from electromagnetic interference (EMI) radiation. Together, the air stream distribution apparatus 40 and the circuit board components 38 form an air stream distribution assembly 42.

Figure 2:
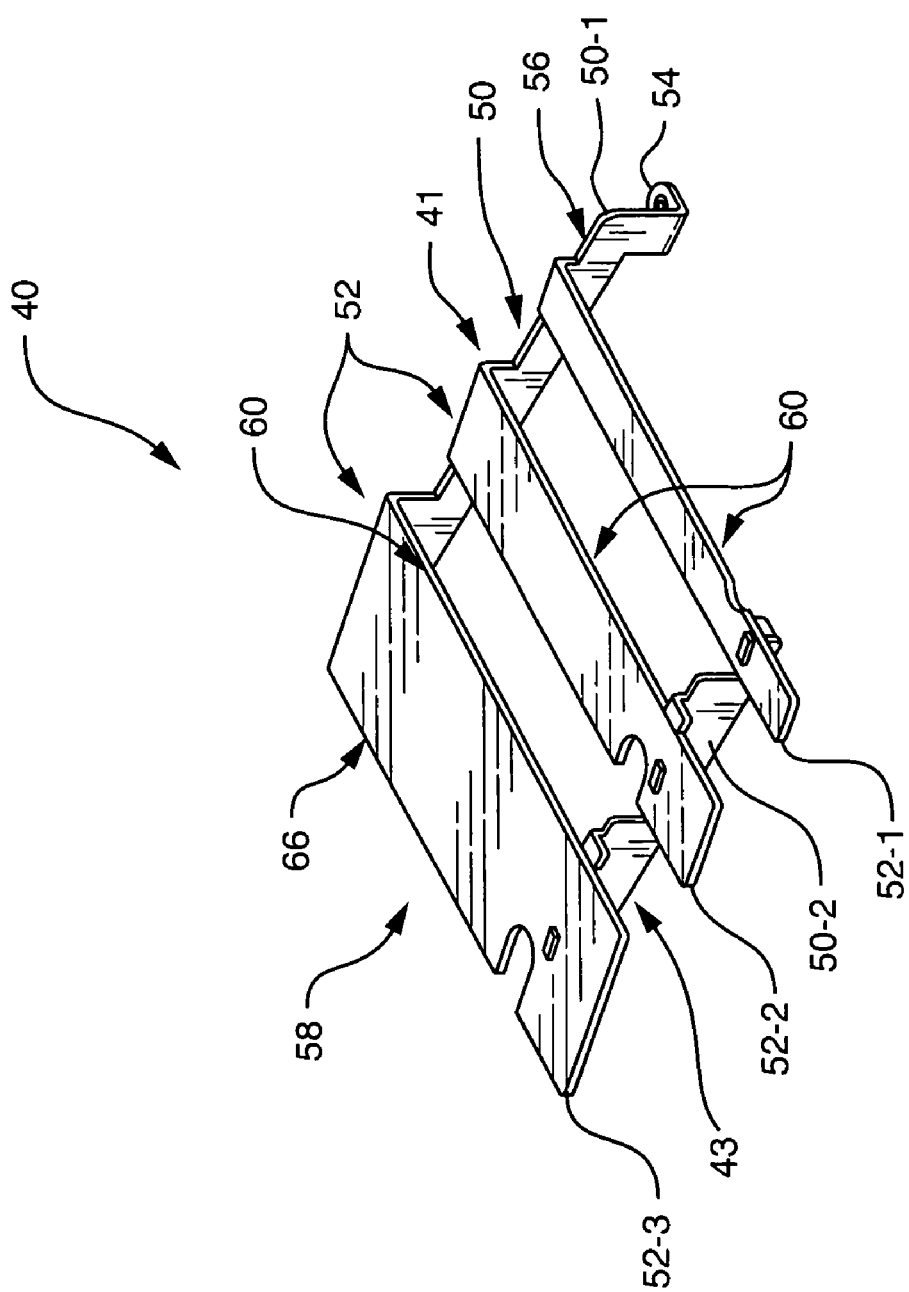
FIG. 2 illustrates a perspective view of the air stream distribution apparatus of FIG. 1, according to one embodiment of the invention.

FIG. 2 illustrates, in one arrangement, the air stream distribution apparatus 40 of the circuit board assembly 30. The air stream distribution apparatus 40 has a base 50 and deflectors or fins 52 coupled to the base 50. The configuration of the deflectors 52 of the air stream distribution apparatus 40 distributes portions of an air stream to multiple circuit board components 38 (e.g., circuit board components arranged in a series or side-by-side configuration relative to an air stream 28) thereby providing adequate convection cooling to each circuit board component 38.

The base 50, in one arrangement, is configured to position the deflectors 52 of the airflow distribution apparatus 40 relative to circuit board components 38 coupled to the circuit board 36. The base 50, therefore, allows the deflectors 52 to direct air from an air stream 28 to the circuit board components 38. For example, as illustrated, the base 50 has an attachment portion 54 that allows the airflow distribution apparatus 40 to secure to an associated circuit board 36. The base 50 defines a first end 56 and a second end 58 of the airflow distribution apparatus 40. The first end 56 of the base 50 is configured, in one arrangement, as an air stream inlet, positioned proximal to an air stream source (e.g., fan assembly 26), that allows in air stream 28 to enter the airflow distribution apparatus 40. The second end 58 defined by the base 50, is configured, in one arrangement, as an air stream outlet, positioned distal to the air stream source, that provides an exhaust outlet for the air stream 28 from the airflow distribution apparatus 40.

Each deflector 52 couples with (e.g., is in communication with) the base 50 in a serial arrangement between the first end 56 defined by the base 50 and the second end 58 defined by the base 50. In serial arrangement of the deflectors 52, the deflectors 52 couple to the base in succession (e.g., one after the other) between the first end 56 and the second end 58 of the base 50. For example, assume the airflow distribution apparatus 40 has a first deflector 52-1, a second deflector 52-2, and a third deflector 52-3. In a serial arrangement of the deflectors 52-1, 52-2. 52-3, the first deflector 52-1 couples to the base 50 in proximity to the first end 56 of the base 50, the second deflector 52-2 couples to the base 50 in a location distal to the first deflector 52-1, and the third deflector 52-3 couples to the base 50 in a location distal to both the first deflector 52-1 and the second deflector 52-2.

Figure 3:
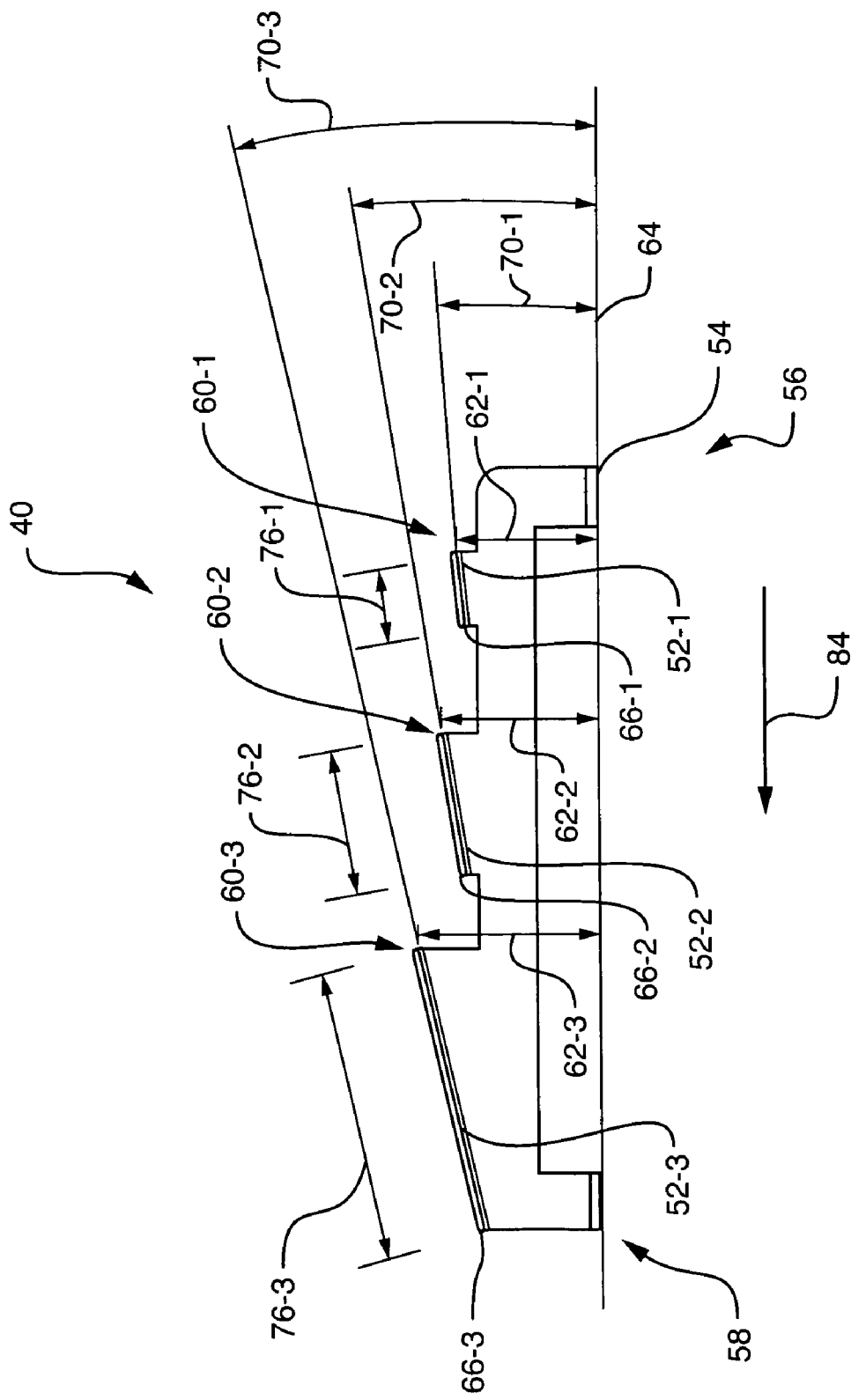
FIG. 3 illustrates a side view of the air stream distribution apparatus of FIG. 2, according to one embodiment of the invention.

FIG. 3, in conjunction with FIG. 2, illustrates each deflector 52 of the airflow distribution apparatus 40 as defining a leading edge 60. The leading edge 60 of each deflector 52, in turn, defines a height 62 relative to a plane 64 defined by the base 50. For example, as shown in FIG. 3, the airflow distribution apparatus 40 has a first deflector 52-1, a second deflector 52-2, and a third deflector 52-3. The first deflector 52-1 defines a first leading edge 60-1 oriented at a height 62-1 relative to the plane (e.g., datum) 64 defined by the base 50. The second deflector 52-2 defines a second leading edge 60-2 oriented at a second height 62-2 relative to the plane 64 defined by the base 50. The third deflector 52-3 defines a third leading edge 60-3 oriented at a third height 62-3 relative to the plane 64 defined by the base 50.

As shown, the height 62-1, 62-2, 62-3 of each respective deflector 52-1, 52-2, 52-3 increases, relative to the plane 64, along an air stream direction 84 from the first end 56 of the base 50 to the second end 58 of the base 50. For example, during operation, the air stream 28 travels from the fan assembly 26, relative to the base 50 and along direction 84, such that the air stream 28 first contacts the airflow distribution apparatus 40 at the first end 56 of the base 50. The height 62 of each respective deflector 52 therefore increases, relative to the plane 64 and along the air stream direction 84, such that the second height 62-2 defined by the second deflector 52-2 is greater than the first height 62-1 defined by the first deflector 52-1, and the third height 62-3 defined by the third deflector 52-3 is greater than the heights 62-1, 62-2 of either the first deflector 52-1 or the second deflector 52-2, respectively.

In such a configuration of the deflectors (e.g., a "stepped" configuration), each deflector 52-1, 52-2, 52-3 impinges a distinct portion of an air stream 28 flowing past the airflow distribution apparatus 40 and directs the corresponding portion of the air stream 28 toward a respective area of a circuit board 36, such as toward multiple circuit board components 38 coupled to the circuit board 36. For example, assume the case where the circuit board has multiple circuit board components 38 arranged in a side-by-side (e.g., serial) manner relative to an air stream source (e.g., fan assembly 26). The configuration of the deflectors 52 minimizes the ability for a first circuit board component 38-1, located proximal to the air stream source 26, from deflecting the air stream 28 away from a second circuit board components 38-2 located distal to the air stream source 26 and behind the first circuit board component 38-1. The configuration of the deflectors 52 (e.g., the different heights 62-1, 62-2, 62-3 defined by each respective deflector 52-1, 52-2, 52-3), therefore, maximizes contact between the air stream 28 and the surface area of the circuit board components 38. By maximizing contact between the air stream 28 and the circuit board components 38, the airflow distribution apparatus 40 minimizes overheating of the circuit board components 38 and maintains the temperature of the circuit board components 38 within a particular range (e.g., an operational range required by the circuit board component 38).

Figure 4:
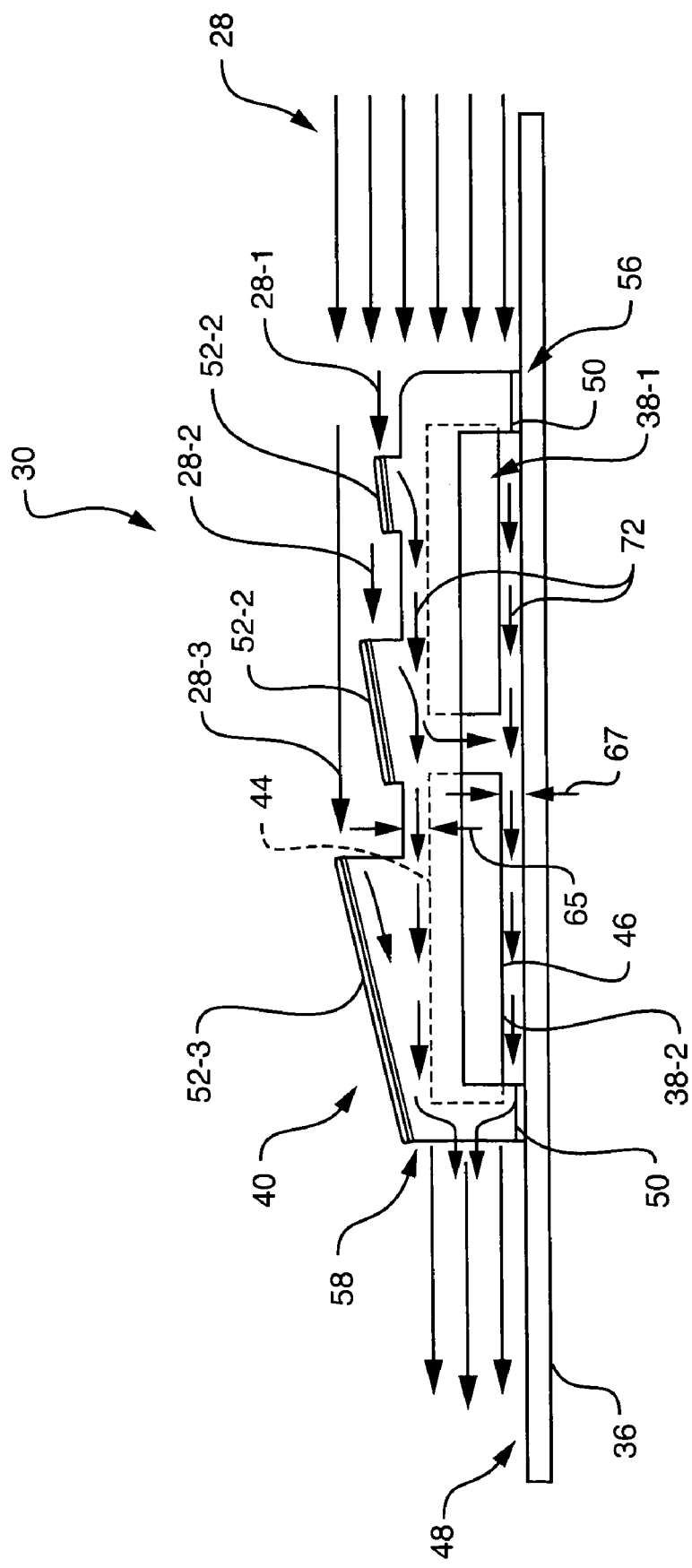
FIG. 4 illustrates operation of the air stream distribution apparatus of FIG. 2, according to one embodiment of the invention.

FIG. 4 illustrates an example operation of the airflow distribution apparatus 40 when configured as part of the circuit board assembly 30. In the arrangement illustrated, the circuit board assembly 30 has a first circuit board component 38-1 and a second circuit board component 38-2 arranged in a side-by-side (e.g., serial) manner relative to an air stream source (e.g., fan assembly 26). The circuit board components 38-1, 38-2, for example, are configured as transceivers having upper surfaces 44 and lower surfaces 46. The upper surfaces 44 of the transceivers 38-1, 38-2 and the airflow distribution apparatus 40 define an upper gap or space 65 that allows the air stream 28, entering the airflow distribution apparatus 40 at the first end 56 of the base 50, to travel across the upper surfaces 44 of the circuit board components 38-1, 38-2. The lower surfaces 46 of the transceivers 38-1, 38-2 define a lower gap or space 65 that allows the air stream 28, entering the airflow distribution apparatus 40 at the first end 56 of the base 50, to travel across the lower surfaces 46 of the circuit board components 38-1, 38-2.

During operation, in one arrangement, the fan assembly 26 directs the air stream 28 across the circuit board 36 (e.g., across the upper surface 48 of the circuit board 36) and toward the circuit board components 38-1, 38-2 associated with the circuit board 36. As the air stream 28 travels from the fan assembly 26, the first deflector 52-1 impinges a first portion 28-1 of the air stream 28 and directs the first portion 28-1 of the air stream 28 toward the first circuit board component 38-1 to aid in reducing the temperature of the first circuit board component 52-1. The second deflector 52-2, in turn, impinges a corresponding second portion 28-2 of the air stream 28 and directs the second portion 28-2 of the air stream 28 toward both the first circuit board component 38-1 and the second circuit board component 38-2 to aid in reducing the temperature of the first 52-1 and second 52-2 circuit board component. The third deflector 52-3, furthermore, impinges a corresponding third portion 28-3 of the air stream 28 and directs the third portion 28-3 of the air stream 28 toward the second circuit board component 38-2. The configuration of the deflectors 52-1, 52-2, 52-3, therefore, directs (e.g., distributes) the air stream 28 to the transceivers 38-1, 38-2 to minimize overheating of the transceivers 38-1, 38-2.

In one arrangement, the second deflector 52-2, furthermore, merges the second portion 28-2 of the air stream 28 with the air traveling in the upper gap 65 and the lower gap 67 of the circuit board assembly 30 to provide additional cooling to the second circuit board component 38-2. For example, after the first deflector 52-1 directs the first portion 28-1 of the air stream 28 toward the first circuit board component 38-1, the first portion 28-1 of the air stream 28 travels within the upper gap 65 and lower gap 67 relative to the first circuit board component 38-1 as air 72. As the air 72 travels within the upper 65 and lower 67 gaps, the first circuit board component 38-1 heats the air 72 such that the temperature of the air 72 is greater than the temperature of the first air stream portion 28-1. The airflow distribution apparatus 40 then directs the heated air 72 within the gaps 65, 67 toward the second circuit board component 38-2. The second deflector 52-2, however, merges the second portion 28-2 of the air stream 28 with the heated air 72 traveling in the upper gap 65 and the lower gap 67 relative to the first circuit board component 38-1, thereby lowering the temperature of the heated air 72. The second circuit board component 38-2, therefore, receives both the second air portion 28-2 from the second deflector 52-2 and receives the cooled air 72 (e.g., heated air 72 cooled by the second air portion 28-2) traveling in the gaps 65, 67 from the first circuit board component 38-1.

In one arrangement, the deflector 52 creates turbulence in the portion of the air stream 28 (e.g., converts the flow of the portion of the air stream 28 from laminar to turbulent) and directs the turbulent air stream portion toward the circuit board components 38. By creating turbulence in a portion of the air stream 28, the deflector 52 minimizes stagnation of the portion of the air stream 28 within the airflow distribution apparatus 40. Stagnation of the portion of the air stream 28 relative to a circuit board component 38 can lead to a localized increase in temperature of the circuit board component 38 in the area of the stagnation (e.g., "hot spot"), thereby leading to failure of the circuit board component 38. The deflector 52, therefore, maximizes a cooling effect of the air stream 28 on the circuit board component 38 and minimizes malfunction or failure of the circuit board component 38.

In conventional circuit boards, as an air stream travels across a surface of the circuit board and contacts multiple circuit board components, the circuit board components create drag on the air stream. The drag causes the air stream to experience a pressure loss and a decrease in velocity as the distance between the air stream and an air stream source increases. Such a pressure and velocity loss can limit the ability for the air stream to effectively cool a circuit board component located at a relatively large distance from the air stream source. The configuration of the present airflow distribution apparatus 40, in one arrangement, minimizes a loss in pressure and velocity of the air stream 28 as the air stream 28 travels from the fan assembly 26 and across a surface of the circuit board 36.

Figure 5:
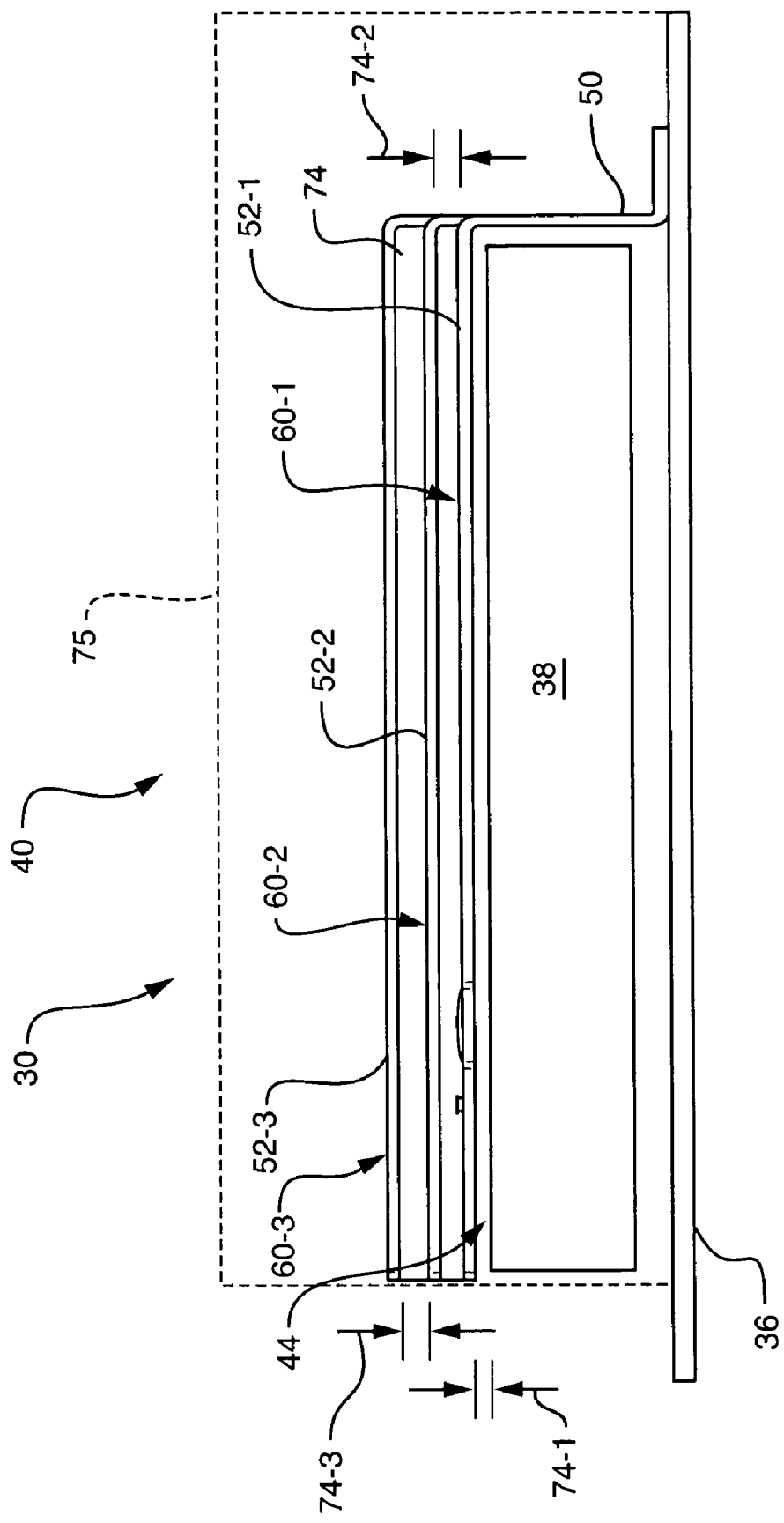
FIG. 5 illustrates a front view of the air stream distribution apparatus of FIG. 2, according to one embodiment of the invention.

FIG. 5 illustrates a front view of an arrangement of the deflectors 52 of the air stream distribution apparatus 40, for example. The deflectors 52 of the air stream distribution apparatus 40 defines openings 74 configured to increase the velocity and minimize the reduction in pressure of the air stream 28 (e.g., air stream portions 28-1, 28-2, 28-3) as the air stream 28 travels from the fan assembly 26 to the circuit board components 38. For example, the leading edge 60-1 of the first deflector 52-1 and the upper surface 44 of the circuit board component 38 define a first opening 74-1, the leading edge 60-2 of the second deflector 52-2 and the leading edge 60-1 of the first deflector 52-1 define a second opening 74-2, and the leading edge 60-3 of the third deflector 52-2 and the leading edge 60-2 of the second deflector 52-2 define a third opening 74-3.

As shown, a cross-sectional area defined by each of the openings 74-1, 74-2, 74-3 is relatively narrow (e.g., smaller) compared to the cross-sectional area 75 of the circuit board assembly 30 available to the air stream 28. Assume the air stream 28 flows at a first rate or velocity through the circuit board assembly 30 (e.g., the cross-sectional area 75 of the circuit board assembly 30). As the air stream 28 flows through the relatively narrow openings 74-1, 74-2, 74-3 (e.g., the cross-sectional area of the openings 74-1, 74-2, 74-3 being smaller than cross-sectional area 75 of the circuit board assembly 30) the openings 74-1, 74-2, 74-3 increase the velocity of the air stream 28 (e.g., the air stream 28 flows at a second rate or velocity through the openings 74-1, 74-2, 74-3). Such an increase in the velocity of the air stream 28 within the airflow distribution apparatus 40 minimizes a pressure drop in the air stream 28 as the air stream 28 travels from the fan assembly 26 across multiple circuit board components 38. For a series of circuit board components 38, such an increase in the velocity of the air stream 28 within the airflow distribution apparatus 40 allows the air stream 28 to contact (e.g., cool) the last circuit board component 38 (e.g., the circuit board component 38 located furthest from the fan assembly 26) of the circuit board assembly 30.

As described, the height 62 of the deflectors 52 relative to a plane 64 defined by the base 50 allows distribution of an air stream 28 toward multiple circuit board components 38 for cooling of the circuit board components 38. Additional aspects of the deflector geometry and orientation within the air stream distribution apparatus 40 also aid in cooling the circuit board components 38.

Returning to FIG. 3, each deflector 52 of the air stream distribution apparatus 40 defines an angle 70 relative to a plane 64 defined by the base 50. For example, assume the attachment mechanisms 54 of the base 50 define the plane 64. In such a case, the first deflector 52-1 defines a first angle 70-1 relative to the plane 64, the second deflector 52-2 defines a second angle 70-2 relative to the plane 64, and the third deflector 52-3 defines a third angle 70-3 relative to the plane 64.

In one arrangement, the angle of each deflector 52 increases, relative to the plane 64 defined by the base 50, along the air stream direction 84 between the first end 56 and the second end 58 of the base 50. As indicated above, during operation, the air stream 28 travels from the fan assembly 26, relative to the base 50 and along the air stream direction 84, such that the air stream 28 first contacts the airflow distribution apparatus 40 at the first end 56 of the base 50. With respect to the angle of each deflector 52, relative to the plane 64, therefore, the second angle 70-2 of the second deflector 52-2 is greater than the first angle 70-1 of the first deflector 52-1 and the third angle 70-3 of the third deflector 52-3 is greater than the angles 70-1, 70-2 of either the first deflector 52-1 or the second deflector 52-2, respectively. For example, the first angle 70-1 defined by the first deflector 52-1 relative to the plane 64 is approximately 4°, the second angle 70-2 defined by the second deflector 52-2 relative to the plane 64 is approximately 9.5°, and the third angle 70-3 defined by the third deflector 52-3 relative to the plane 64 is approximately 12.5°.

In the arrangement shown, the angle 70 of each deflector 52 increases as the distance between each deflector 52 and the source or fan assembly 26 increases. Such an arrangement of the deflectors 52 allows deflectors 52 (e.g., deflector 52-3) located at a relatively large distance from the air stream source (e.g., fan assembly 26) to capture a volume of air (e.g., air portion 28-3) sufficient to contact the surface (e.g., surface area) of an associated circuit board component 38 and, therefore, provide convection cooling to the associated circuit board component 38 (e.g., a second circuit board component 38-2 located at a relatively large distance from the air stream source 26) during operation.

Also as illustrated in FIG. 3, each deflector 52 defines a trailing edge 66. For example, the first deflector 52-1 defines a first trailing edge 66-1, the second deflector 52-2 defines a second trailing edge 66-2, and the third deflector 52-3 defines a third trailing edge 66-3. Each deflector 52 also defines a corresponding deflector length 76 as a distance between the leading edge 60 of the deflector 52 and the trailing edge 66 of the deflector 52. In one arrangement, the deflector length 76 of each deflector 52 increases along the air stream direction 84 between the first end 56 and the second end 58 defined by the base 50. Therefore, the second length 76-2 of the second deflector 52-2 is greater than the first length 76-1 of the first deflector 52-1 and the third length 76-3 of the third deflector 52-3 is greater than the lengths 76-1, 76-2 of either the first deflector 52-1 or the second deflector 52-2, respectively. For example, the first length 76-1 defined by the first deflector 52-1 is approximately 1.75 inches, the second length 76-2 defined by the second deflector 52-2 is approximately 0.85 inches, and the third length 76-3 defined by the third deflector 52-3 is approximately 0.45 inches.

In the arrangement shown, the length 76 of each deflector 52 increases as the distance between each deflector 52 and the source or fan assembly 26 increases. Such an arrangement of the deflectors 52 allows deflectors 52 (e.g., deflector 52-3) located at a relatively large distance from the air stream source (e.g., fan assembly 26) to capture a volume of air (e.g., air portion 28-3) sufficient to contact the surface of an associated circuit board component 38 and, therefore, cool the associated circuit board component 38 (e.g., a second circuit board component 38-2 located at a relatively large distance from the air stream source 26) during operation.

Additionally, as the air stream 28 travels away from the air stream source 26, the velocity of the air stream 28 decreases due to a loss in momentum of the air stream. For example, for the deflector 52-3 located at a relatively large distance from the air stream source 26, an increase in the length 76 of the deflector 52-3, relative to a deflector 52-1 located in proximity to the fan assembly 26, creates an increase in the velocity of the portion 28-3 of the air stream 28 captured by the deflector 52-3. Such an increase in velocity of the associated air stream portion 28-3 counters a loss of momentum of the air stream 28 traveling in the vicinity of the deflector 52-3. By countering the loss in momentum of the air stream 28, the increasing length 76 of the deflectors 52 allows the airflow distribution apparatus 40 to provide convection cooling to circuit board components 38 located at a relatively large distance from the fan assembly 26.

As shown in FIGS. 2 and 3, the deflectors 52 of the air stream distribution apparatus 40 are configured as having substantially rectangular cross-sectional profiles. In one arrangement, the deflectors 52 are configured as having substantially non-rectangular cross-sectional profiles.

Figure 6:
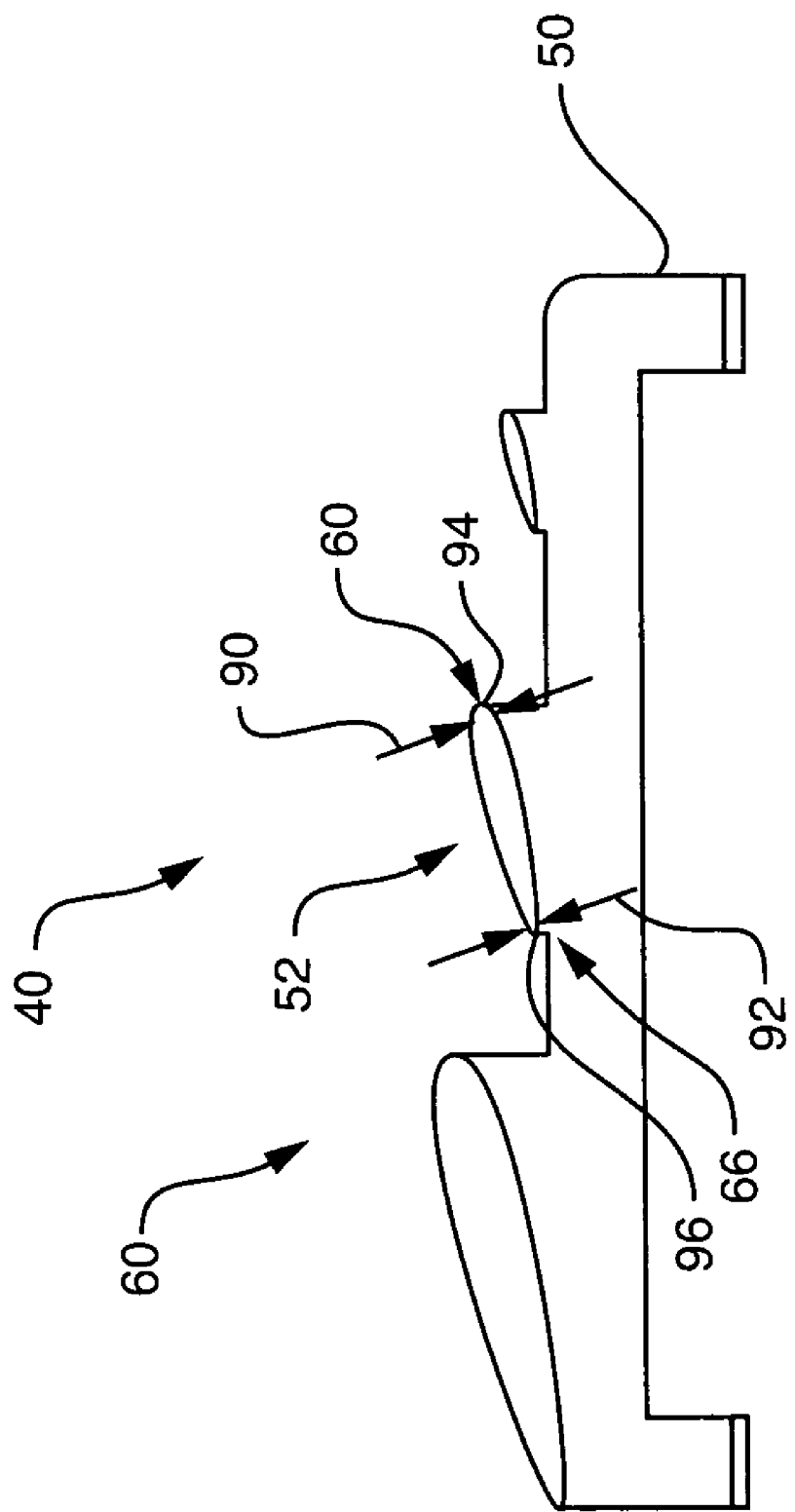
FIG. 6 illustrates a side view of the air stream distribution apparatus of FIG. 2, according to one embodiment of the invention.

FIG. 6 illustrates one arrangement of the deflectors 52 of the airflow distribution apparatus 40. The deflector 52 defines a leading edge 60 where the leading edge 60 defines a first thickness 90. The deflector 52 also defines a trailing edge 66 where the trailing edge 66 defines a second thickness 92 where the second thickness 92 of the trailing edge 66 is smaller (e.g., less than) the first thickness 90 of the leading edge 60. For example, in one arrangement, the leading edge 60 of the deflector 52 defines a substantially rounded edge 94 and the trailing edge 66 of the deflector 52 defines a tapered edge 96. In such an arrangement, the deflector 52 defines a lifting body or airfoil cross-sectional shape. The airfoil shape minimizes a loss in pressure and velocity of an air stream 28 as the air stream 28 travels from a fan assembly 26 and across circuit board components 38 of a circuit board assembly 30. The airfoil shape, furthermore, captures a volume of air from the air stream 28 to provide adequate convection cooling to an associated circuit board component 38.

Figure 7:
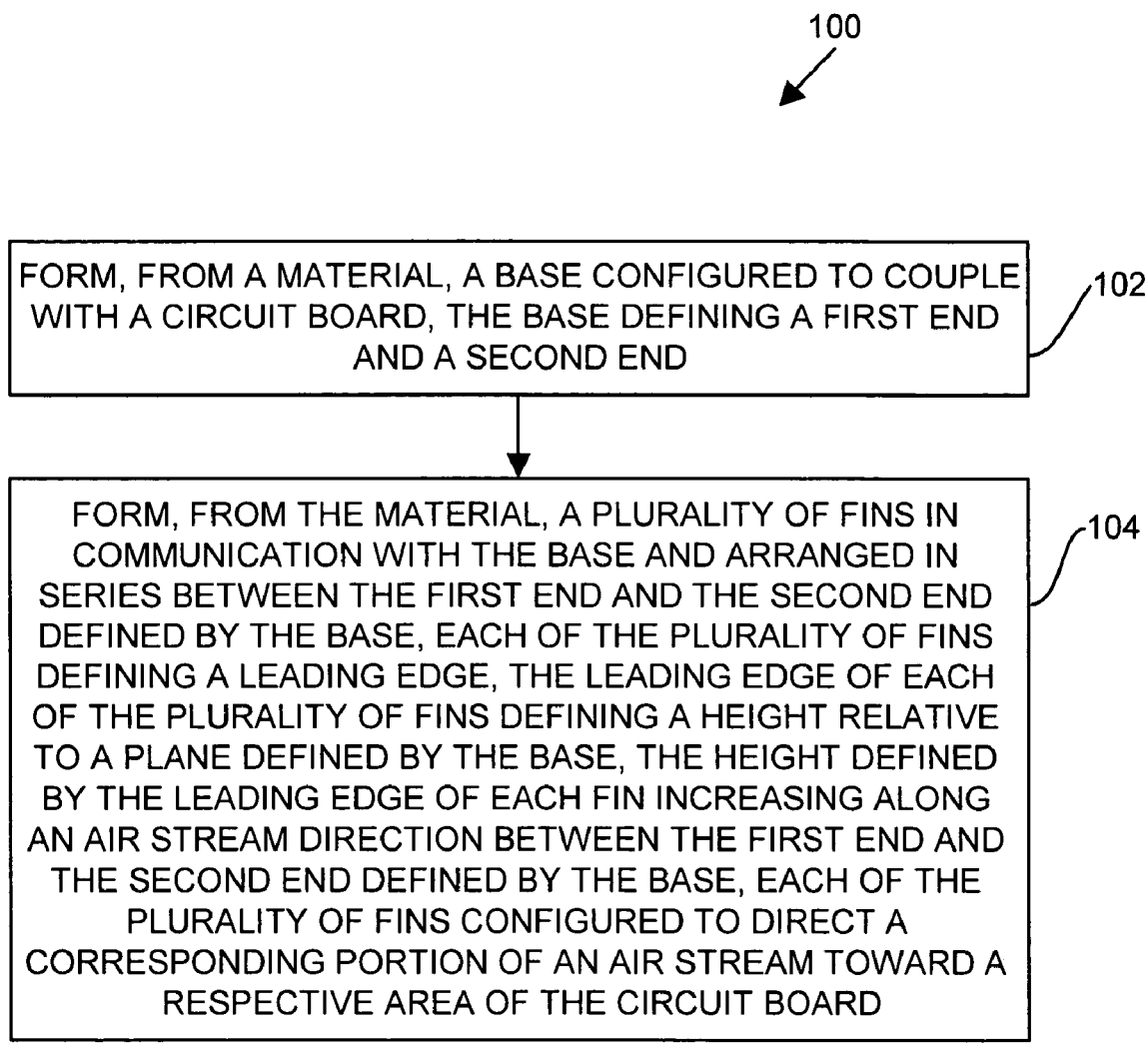
FIG. 7 illustrates a flowchart of procedure for manufacturing an air stream distribution apparatus, according to one embodiment of the invention.

FIG. 7 illustrates a method 100 for manufacturing an air stream distribution apparatus 40, according to one embodiment of the invention. Such a method can be performed either manually (e.g., by a technician on an assembly line) or automatically (e.g., by automated equipment).

In step 102, an assembler forms, from a material, a base 50 configured to couple with a circuit board 36, the base 50 defining a first end 56 and a second end 58. For example, the assembler forms the base 50 by stamping a sheet of cold-rolled steel.

In step 102, the assembler forms, from the material, deflectors 52 in communication with the base 50 and arranged in series between the first end 56 and the second end 58 defined by the base 50, each of the deflectors 52 define a leading edge 60, the leading edge 60 of each of the deflectors 52 defining a height 62 relative to a plane 64 defined by the base 50, the height 62, defined by the leading edge 60, of each deflector 52 increasing along an air stream direction 84 between the first end 56 and the second end 58 defined by the base 50, the deflectors 52 configured to direct a corresponding portion of an air stream 28 toward a respective area of the circuit board 36. For example, the assembler forms the deflectors 52 during the stamping process used to form the base 50.

By forming the deflectors 52 as having an increasing height 62 along the base 50, from the first end 56 to the second end 58, the manufacturer configures the air stream distribution apparatus 40 to impinge distinct portions of an air stream 28 flowing past the airflow distribution apparatus 40 and direct the corresponding portion of the air stream 28 toward a respective area of a circuit board 36, such as toward circuit board components 38 coupled to the circuit board 36. The different heights 62 defined by each respective deflector 52 therefore, optimizes flow distribution for the best cooling performance of circuit board components 38 and minimizes overheating of the circuit board components 38.

Those skilled in the art will understand that there can be many variations made to the embodiments explained above while still achieving the same objective of those embodiments and the invention in general.

In one arrangement, the combination of two separate airflow distribution apparatus components forms the airflow distribution apparatus 40. For example, as illustrated in FIG. 2, the airflow distribution apparatus 40 has a first apparatus component 41 having a first base portion 50-1 and deflectors 52 integrally formed with the first base portion 50-1. The airflow distribution apparatus 40 also has a second apparatus component 43 that forms a second base portion 50-2 for the airflow distribution apparatus 40. The second apparatus component 43 removably attaches to the deflectors 52 and aids in securing the airflow distribution apparatus 40 to a circuit board assembly 30.

FIG. 4 illustrates the airflow distribution apparatus 40 as having three deflectors 52-1, 52-2, 52-3 to aid in cooling two circuit board components 38-1, 38-2. Such an illustration is by way of example only. In one arrangement, the airflow distribution apparatus 40 is configured with multiple deflectors 52 to direct portions of an air stream 28 to a single, relatively large circuit board component 38. In another arrangement, the airflow distribution apparatus 40 is configured with multiple deflectors 52 to capture and direct portions of an air stream 28 to three or more circuit board components 38.

FIG. 4 illustrates the airflow distribution apparatus 40 as mounted to the upper surface 48 of the circuit board 36. Such an illustration is by way of example only. In one arrangement, in the case where the circuit board components 38 couple to a lower surface of the circuit board 36 (e.g., a surface of the circuit board 36 opposite to the upper surface 48), the airflow distribution apparatus 40 is configured to couple to the a lower surface of the circuit board 36 to provide portions of the air stream 28 to the circuit board components.

As described above, the deflectors 52 of the airflow distribution apparatus 40 define angles 70 relative to a plane 64 defined by the base 50 and lengths 76 defined between the leading edge 60 and trailing edge 66 of each deflector 52. Based upon particular angles 70 and lengths 76, the airflow distribution apparatus 40 is well suited for use in relatively narrow channels. For example, as indicated above, the first length 76-1 defined by the first deflector 52-1 is approximately 1.75 inches, the second length 76-2 defined by the second deflector 52-2 is approximately 0.85 inches, and the third length 76-3 defined by the third deflector 52-3 is approximately 0.45 inches. Furthermore, as indicated above, the first angle 70-1 defined by the first deflector 52-1 relative to the plane 64 is approximately 4°, the second angle 70-2 defined by the second deflector 52-2 relative to the plane 64 is approximately 9.5°, and the third angle 70-3 defined by the third deflector 52-3 relative to the plane 64 is approximately 12.5°. With such a configuration of the angles 70 and lengths 76 of the deflectors 52, the airflow distribution apparatus 40 is configured to fit and operate within a channel defining an approximately 1.5 inch channel space.

Such variations are intended to be covered by the scope of this invention. As such, the foregoing description of embodiments of the invention is not intended to be limiting. Rather, any limitations to the invention are presented in the following claims.

What is claimed is:

1. An air stream distribution apparatus comprising:
   a base configured to couple with a circuit board, the base defining a first end and a second end; and
   a plurality of deflectors in communication with the base and arranged in series between the first end and the second end defined by the base, each of the plurality of deflectors defining a leading edge, the leading edge of each of the plurality of deflectors defining a height relative to a plane defined by the base, the height defined by the leading edge of each deflector increasing along an air stream direction between the first end and the second end defined by the base, each of the plurality of deflectors configured to direct a corresponding portion of an air stream toward a respective area of the circuit board;
   wherein each of the plurality of deflectors is configured to direct a corresponding portion of an air stream flowing substantially parallel to the circuit board toward at least one circuit board component of the circuit board.

2. The air stream distribution apparatus of claim 1 wherein each deflector of the plurality of deflectors defines an angle relative to the plane defined by the base, the angle of each deflector increasing, relative to the plane defined by the base, along the air stream direction between the first end and the second end defined by the base.

3. The air stream distribution apparatus of claim 1 wherein the each deflector of the plurality of deflectors defines a trailing edge, a distance between the leading edge and the trailing edge defining a deflector length, the deflector length of each deflector increasing along the air stream direction between the first end and the second end defined by the base.

4. The air stream distribution apparatus of claim 1 wherein the leading edge defined by at least one deflector of the plurality of deflectors further defines a first thickness and wherein the at least one deflector defines a trailing edge further defining a second thickness, the second thickness of the trailing edge less than the first thickness of the leading edge.

5. The air stream distribution apparatus of claim 4 wherein the leading edge defined by the at least one deflector further defines a substantially rounded edge and wherein the trailing edge defined by the at least one deflector further defines a substantially tapered edge.

6. An air stream distribution assembly comprising:
at least one circuit board component configured to couple to a circuit board; and
an air stream distribution apparatus having:
a base configured to couple with the circuit board, the base defining a first end and a second end, and
a plurality of deflectors in communication with the base and arranged in series between the first end and the second end defined by the base, each of the plurality of deflectors defining a leading edge, the leading edge of each of the plurality of deflectors defining a height relative to a plane defined by the base, the height defined by the leading edge of each deflector increasing along an air stream direction between the first end and the second end defined by the base, each of the plurality of deflectors configured to direct a corresponding portion of an air stream toward the at least one circuit board component,
wherein each of the plurality of deflectors is configured to direct a corresponding portion of an air stream flowing substantially parallel to the circuit board toward the at least one circuit board component of the circuit board.

7. The air stream distribution assembly of claim 6 wherein each deflector of the plurality of deflectors defines an angle relative to the plane defined by the base, the angle of each deflector increasing, relative to the plane defined by the base, along the air stream direction between the first end and the second end defined by the base.

8. The air stream distribution assembly of claim 6 wherein the each deflector of the plurality of deflectors defines a trailing edge, a distance between the leading edge and the trailing edge defining a deflector length, the deflector length of each deflector increasing along the air stream direction between the first end and the second end defined by the base.

9. The air stream distribution assembly of claim 6 wherein the leading edge defined by at least one deflector of the plurality of deflectors further defines a first thickness and wherein the at least one deflector defines a trailing edge further defining a second thickness, the second thickness of the trailing edge less than the first thickness of the leading edge.

10. The air stream distribution apparatus of claim 9 wherein the leading edge defined by the at least one deflector further defines a substantially rounded edge and wherein the trailing edge defined by the at least one deflector further defines a substantially tapered edge.

11. The air stream distribution assembly of claim 6 wherein the at least one circuit board component comprises at least one transceiver module removeably coupled to the support and wherein each of the plurality of deflectors are configured to direct the corresponding portion of the air stream toward the at least one transceiver module.

12. A circuit board assembly comprising:
a circuit board;
at least one circuit board component coupled to the circuit board; and
an air stream distribution apparatus having:
a base configured to couple with the circuit board, the base defining a first end and a second end, and
a plurality of deflectors in communication with the base and arranged in series between the first end and the second end defined by the base, each of the plurality of deflectors defining a leading edge, the leading edge of each of the plurality of deflectors defining a height relative to a plane defined by the base, the height defined by the leading edge of each deflector increasing along an air stream direction between the first end and the second end defined by the base, each of the plurality of deflectors configured to direct a corresponding portion of an air stream toward the at least one circuit board component,
wherein each of the plurality of deflectors is configured to direct a corresponding portion of an air stream flowing substantially parallel to the circuit board toward the at least one circuit board component of the circuit board.

13. The circuit board assembly of claim 12 wherein each deflector of the plurality of deflectors defines an angle relative to the plane defined by the base, the angle of each deflector increasing, relative to the plane defined by the base, along the air stream direction between the first end and the second end defined by the base.

14. The circuit board assembly of claim 12 wherein the each deflector of the plurality of deflectors defines a trailing edge, a distance between the leading edge and the trailing edge defining a deflector length, the deflector length of each deflector increasing along the air stream direction between the first end and the second end defined by the base.

15. The circuit board assembly of claim 12 wherein the leading edge defined by at least one deflector of the plurality of deflectors further defines a first thickness and wherein the at least one deflector defines a trailing edge further defining a second thickness, the second thickness of the trailing edge less than the first thickness of the leading edge.

16. The circuit board assembly of claim 15 wherein the leading edge defined by the at least one deflector further defines a substantially rounded edge and wherein the trailing edge defined by the at least one deflector further defines a substantially tapered edge.

17. The circuit board assembly of claim 12 wherein the at least one circuit board component comprises at least one transceiver module removeably coupled to the circuit board and wherein each of the plurality of deflectors are configured to direct the corresponding portion of the air stream toward the at least one transceiver module.

18. A computer system comprising:
a frame;
a fan assembly coupled to the frame and configured to generate an air stream; and
at least one circuit board assembly coupled to the frame, the circuit board assembly having:
a circuit board,
at least one circuit board component coupled to the circuit board, and
an air stream distribution apparatus having:
a base configured to couple with the circuit board, the base defining a first end and a second end; and
a plurality of deflectors in communication with the base and arranged in series between the first end and the second end defined by the base, each of the plurality of deflectors defining a leading edge, the leading edge of each of the plurality of deflectors defining a height relative to a plane defined by the base, the height defined by the leading edge of each deflector increasing along an air stream direction between the first end and the second end defined by the base, each of the plurality of deflectors configured to direct a corresponding portion of an air stream toward the at least one circuit board component, wherein each of the plurality of deflectors is configured to direct a corresponding portion of an air stream flowing substantially parallel to the circuit board toward the at least one circuit board component of the circuit board.

19. A method for manufacturing an air stream distribution apparatus comprising:

forming, from a material, a base configured to couple with a circuit board, the base defining a first end and a second end; and forming, from the material, a plurality of deflectors in communication with the base and arranged in series between the first end and the second end defined by the base, each of the plurality of deflectors defining a leading edge, the leading edge of each of the plurality of deflectors defining a height relative to a plane defined by the base, the height defined by the leading edge of each deflector increasing along an air stream direction between the first end and the second end defined by the base, each of the plurality of deflectors configured to direct a corresponding portion of an air stream toward a respective area of the circuit board, wherein each of the plurality of deflectors is configured to direct a corresponding portion of an air stream flowing substantially parallel to the circuit board toward the at least one circuit board component of the circuit board.

20. The method of claim 19 comprising forming each deflector of the plurality of deflectors at an angle relative to the plane defined by the base, the angle of each deflector increasing, relative to the plane defined by the base, along the air stream direction between the first end and the second end defined by the base.

21. The method of claim 19 comprising, forming a trailing edge for each deflector of the plurality of deflectors, a distance between the leading edge and the trailing edge defining a deflector length, the deflector length of each deflector increasing along the air stream direction between the first end and the second end defined by the base.

22. The method of claim 19 comprising forming the leading edge of at least one deflector of the plurality of deflectors as having a first thickness and forming a trailing edge of the at least one deflector as having a second thickness, the second thickness of the trailing edge being less than the first thickness of the leading edge.

23. The method of claim 19 further comprising, when forming the leading edge, forming a substantially rounded edge and, when forming the trailing edge, forming a substantially tapered edge.

24. The air stream distribution apparatus of claim 1 wherein the air stream distribution apparatus forms a gap between an upper surface of the at least one circuit board component and each of the plurality of deflectors.

25. The air stream distribution apparatus of claim 1 wherein at least one of the plurality of deflectors is operable to create turbulence in the corresponding portion of the air stream directed toward the circuit board.

26. The air stream distribution apparatus of claim 5 wherein the at least one deflector is configured as an airfoil.

* * * * *